(12) United States Patent
Thie et al.

(10) Patent No.: US 12,144,087 B2
(45) Date of Patent: Nov. 12, 2024

(54) INDUCTION HEATING CIRCUIT, PROTECTION CIRCUIT AND COOLING SYSTEM FOR AN APPLIANCE

(71) Applicant: BREVILLE PTY LIMITED, Alexandria (AU)

(72) Inventors: Johnson Thie, Alexandria (AU); Duncan Hellmers, Alexandria (AU); Stephen John McClean, Alexandria (AU)

(73) Assignee: BREVILLE PTY LIMITED, Alexandria (AU)

( * ) Notice: Subject to any disclaimer, the term of this patent is extended or adjusted under 35 U.S.C. 154(b) by 761 days.

(21) Appl. No.: 17/256,977

(22) PCT Filed: Jun. 28, 2019

(86) PCT No.: PCT/AU2019/050684
§ 371 (c)(1),
(2) Date: Dec. 29, 2020

(87) PCT Pub. No.: WO2020/000053
PCT Pub. Date: Jan. 2, 2020

(65) Prior Publication Data
US 2021/0127464 A1    Apr. 29, 2021

(30) Foreign Application Priority Data
Jun. 29, 2018    (AU) ................................ 2018902364

(51) Int. Cl.
*H05B 6/12*    (2006.01)
*G01R 15/20*    (2006.01)
(Continued)

(52) U.S. Cl.
CPC ............ *H05B 6/12* (2013.01); *G01R 15/202* (2013.01); *G01R 19/0092* (2013.01); *H03K 5/24* (2013.01);
(Continued)

(58) Field of Classification Search
CPC .......... H05B 6/06; H05B 6/062; H05B 6/065; H05B 6/12; H05B 6/1236; H05B 6/1245;
(Continued)

(56) References Cited

U.S. PATENT DOCUMENTS 3,417,249 A * 12/1968 Akmenkalns ........ H03K 17/941
250/552
4,447,691 A * 5/1984 Mizukawa ............. H05B 6/062
219/622
(Continued)

FOREIGN PATENT DOCUMENTS

CN    107979360 A    5/2018
EP    2375855 A1    10/2011
(Continued)

OTHER PUBLICATIONS

International Search Report for Application No. PCT/AU2019/050684, mailing date Sep. 20, 2019.
(Continued)

*Primary Examiner* — Eric S Stapleton
*Assistant Examiner* — Yeong Juen Thong
(74) *Attorney, Agent, or Firm* — MOSER TABOADA

(57) ABSTRACT

An induction heating circuit for an appliance, the induction heating circuit comprising: an AC power supply with an AC monitoring output connected to the active line of the AC power supply, the AC monitoring output providing an indication of current being drawn from the AC power supply; a control circuit comprising at least one processor and a semiconductor current sensor, the semiconductor current
(Continued)

sensor arranged to i) detect the current being drawn from the AC power supply and ii) output an output voltage based on the detected current; and an induction driving circuit for driving an inductor of the appliance comprising a semiconductor switch, wherein the semiconductor switch is controlled by the processor based on, at least, the output voltage.

4 Claims, 12 Drawing Sheets

(51) Int. Cl.
  *G01R 19/00*   (2006.01)
  *H03K 5/24*   (2006.01)
  *H05B 6/06*   (2006.01)
  *H05B 6/10*   (2006.01)
  *H05K 7/20*   (2006.01)

(52) U.S. Cl.
  CPC ............... *H05B 6/06* (2013.01); *H05B 6/102* (2013.01); *H05K 7/20136* (2013.01)

(58) Field of Classification Search
  CPC .... H05B 6/1272; H05B 6/1281; H05B 6/102; F24C 7/088; F24C 7/02; F24C 15/10; H05K 7/20136; H03K 5/24; G01R 19/0092; G01R 19/202
  USPC ....... 219/620, 622, 619, 610, 625, 626, 627, 219/662, 663, 664, 665, 600; 363/37, 49, 363/89, 98; 99/325
  See application file for complete search history.

(56) References Cited

U.S. PATENT DOCUMENTS

| | | | | |
|---|---|---|---|---|
| 5,610,453 A | * | 3/1997 | Smith | ............... H02H 6/00 307/130 |
| 5,680,017 A | | 10/1997 | Veldman et al. | |
| 7,019,469 B1 | * | 3/2006 | Thurk | ............... H05B 41/3924 315/307 |
| 9,006,624 B2 | * | 4/2015 | Brosnan | ............... H05B 6/04 315/307 |
| 2004/0118832 A1 | * | 6/2004 | Ryu | ............... H05B 6/04 219/622 |
| 2009/0244794 A1 | * | 10/2009 | Ward | ............... H02H 3/33 361/42 |
| 2011/0007537 A1 | * | 1/2011 | Fornage | ............... H02M 1/08 363/132 |
| 2013/0082046 A1 | * | 4/2013 | Ogasawara | ............ H05B 6/062 219/625 |
| 2019/0372567 A1 | * | 12/2019 | Yoshida | ............. H03K 17/0828 |

FOREIGN PATENT DOCUMENTS

| | | | |
|---|---|---|---|
| JP | 2016/146235 A | | 8/2016 |
| JP | 2016173959 A | * | 9/2016 |
| JP | 2017/211122 A | | 11/2017 |
| KR | 20010057607 A | | 7/2001 |
| KR | 20030027222 A | | 4/2003 |
| WO | WO 2004107819 A1 | | 12/2004 |

OTHER PUBLICATIONS

European Search Report for Application No. 19824466.7 dated Jan. 27, 2022.

High Accuracy, Galvanically Isolated Current Sensor IC With Small Footprint SoIC8 Package, ACS722, Allegro MicroSystems, LLC 115 Northeast Cutoff, Worcester, Massachusetts 01615-0036 U.S.A 1.508.853.5000; www.allegromicro.com, pp. 1-14 dated Jun. 10, 2014.

Chinese Office Action for Application No. CN 2019800425163, dated Oct. 30, 2023.

* cited by examiner

801

INDUCTION HEATING CIRCUIT, PROTECTION CIRCUIT AND COOLING SYSTEM FOR AN APPLIANCE

TECHNICAL FIELD

The present invention relates generally to an improved induction heating circuit, protection circuit and cooling system for an appliance.

BACKGROUND

Many different appliances utilise induction heating techniques to heat loads. For example, inductive cooking tops (or hobs) can utilise inductive elements to heat pans, kettles can be heated by use of induction coils to heat a liquid inside the kettle, and milk frothers can use induction heating to heat liquids, such as milk, inside a receptacle.

An induction heating circuit produces heat on "loads" using the principle of magnetic induction. As mentioned, the loads may typically be cooking pans, pots and jugs. This inductive heating technique has several advantages compared to the conventional heating using heating elements and gas. One important advantage is lower energy loss as the magnetic field from the heating circuit is absorbed fully by the load and in turn, the energy of the magnetic field generates heat on the load. Hence, virtually, no heat is lost to the surrounding. In contrast, heating elements and gas emit some heat to the surrounding. Another advantage is that as the heating circuit does not produce any heat, its surface will not become hot, although in practice, the surface becomes hot because it is in direct contact with the load's base which is heated by the magnetic induction.

However, problems may arise in known induction heating systems in relation to the measuring and/or controlling of the amount of current being drawn by the inductive heating system.

Inductor switching elements may be used in high power circuits and so may be subjected to high transient voltages (e.g. 1200 V) and high transient currents (e.g. 100 A). The switching elements can be damaged for several reasons, such as, for example, overvoltage or overcurrent above the switching elements rating and turning on the switching element while the voltage across the switching element is high. Some common techniques use a bulky current transformer and high-speed ADC (Analogue to Digital Converter) to convert the voltage and current to digital signals which are then sent to a microcontroller to determine whether an over voltage or current situation is occurring switching element. Then, the microcontroller can switch off the IGBT (Insulated Gate Bipolar Transistor) when the voltage or current is above a predefined threshold limit. However, problems may arise when monitoring the operational voltage and/or current of an inductor switching element in that a microcontroller may be too slow in reacting to an over voltage or over current situation.

Inductive elements and circuit elements heat up when being used in these types of systems. However, known cooling arrangements for induction heating systems may not operate efficiently to cool down the inductive and circuit elements.

SUMMARY

It is an object of the present invention to substantially overcome, or at least ameliorate, one or more disadvantages of existing arrangements.

Disclosed are arrangements which seek to address the above problems by providing an improved induction heating system and method, and in particular an improved method and system for monitoring the current drawn by the power supply by the inductor.

According to a first aspect of the present disclosure, there is provided an induction heating circuit for an appliance, the induction heating circuit comprising: an AC power supply with an AC monitoring output connected to the active line of the AC power supply, the AC monitoring output providing an indication of current being drawn from the AC power supply; a control circuit comprising at least one processor and a semiconductor current sensor, the semiconductor current sensor arranged to i) detect the current being drawn from the AC power supply and ii) output an output voltage based on the detected current; and an induction driving circuit for driving an inductor of the appliance comprising a semiconductor switch, wherein the semiconductor switch is controlled by the processor based on, at least, the output voltage.

Preferably, the semiconductor current sensor is a Hall effect integrated circuit semiconductor current sensor.

Preferably, the semiconductor current sensor is directly connected to the AC monitoring output.

Preferably, the semiconductor current sensor is further arranged to detect a load for the appliance to heat using the inductor, whereupon detection of the load by the semiconductor current sensor, the induction driving circuit is arranged to drive the inductor for heating the load and cause the processor to generate a heating operation status, wherein the processor is arranged to determine an operational status based on the output voltage and the heating operation status, and control the induction driving circuit based on the operational status.

Preferably, the processor is arranged to determine that a fault exists based on the operational status.

Preferably, the processor is arranged to determine that the load has been removed based on the operational status.

Preferably, the processor is arranged to determine that heating is not being applied to the load via the inductor based on the operational status.

Preferably, the processor is arranged to determine that heating is being applied to the load via the inductor based on the operational status.

According to a second aspect of the present disclosure, there is provided a protection circuit for protecting an induction heating circuit in an appliance, the protection circuit comprising monitoring circuitry arranged to monitor a switching device in an induction heating circuit, wherein a first voltage in relation to a turn on voltage, a second voltage in relation to a maximum over voltage and a current in relation to a maximum current are monitored by the protection circuit, wherein the circuitry further comprises logic circuitry for clamping a switching signal for the switching device on the basis of the first voltage, second voltage and current.

Preferably the monitoring circuitry has high speed comparators to compare the first voltage, second voltage and current against predefined thresholds.

Preferably the protection circuit has optocouplers arranged to provide electrical isolation and transfer values associated with the monitored first voltage, the monitored second voltage and the monitored current to the logic circuitry.

Preferably the protection circuit further has at least one monostable multivibrator arranged to stretch signals associated with the monitored first voltage, the monitored second voltage and the monitored current.

According to a third aspect of the present disclosure, there is provided a cooling system for an appliance with an induction heating circuit, the cooling system comprising: an air flow input providing input air to a fan, wherein the fan is arranged to change the air flow direction of the input air perpendicularly to a second direction, where the air in the second direction passes over a heatsink for cooling induction circuit elements, the air exiting the heatsink being directed towards an inductor by an airflow diversion element.

Preferably the airflow input is in a horizontal direction, the air exiting the heatsink is in a vertical direction and the airflow diversion element directs the air exiting the heatsink in the horizontal direction.

Preferably the cooling system has an air vent located underneath the inductor to allow the air cooling the inductor to exit after passing the inductor.

Other aspects are also disclosed.

BRIEF DESCRIPTION OF THE DRAWINGS

At least one embodiment of the present invention will now be described with reference to the drawings and appendices, in which.

DETAILED DESCRIPTION INCLUDING BEST MODE

Figure 1:
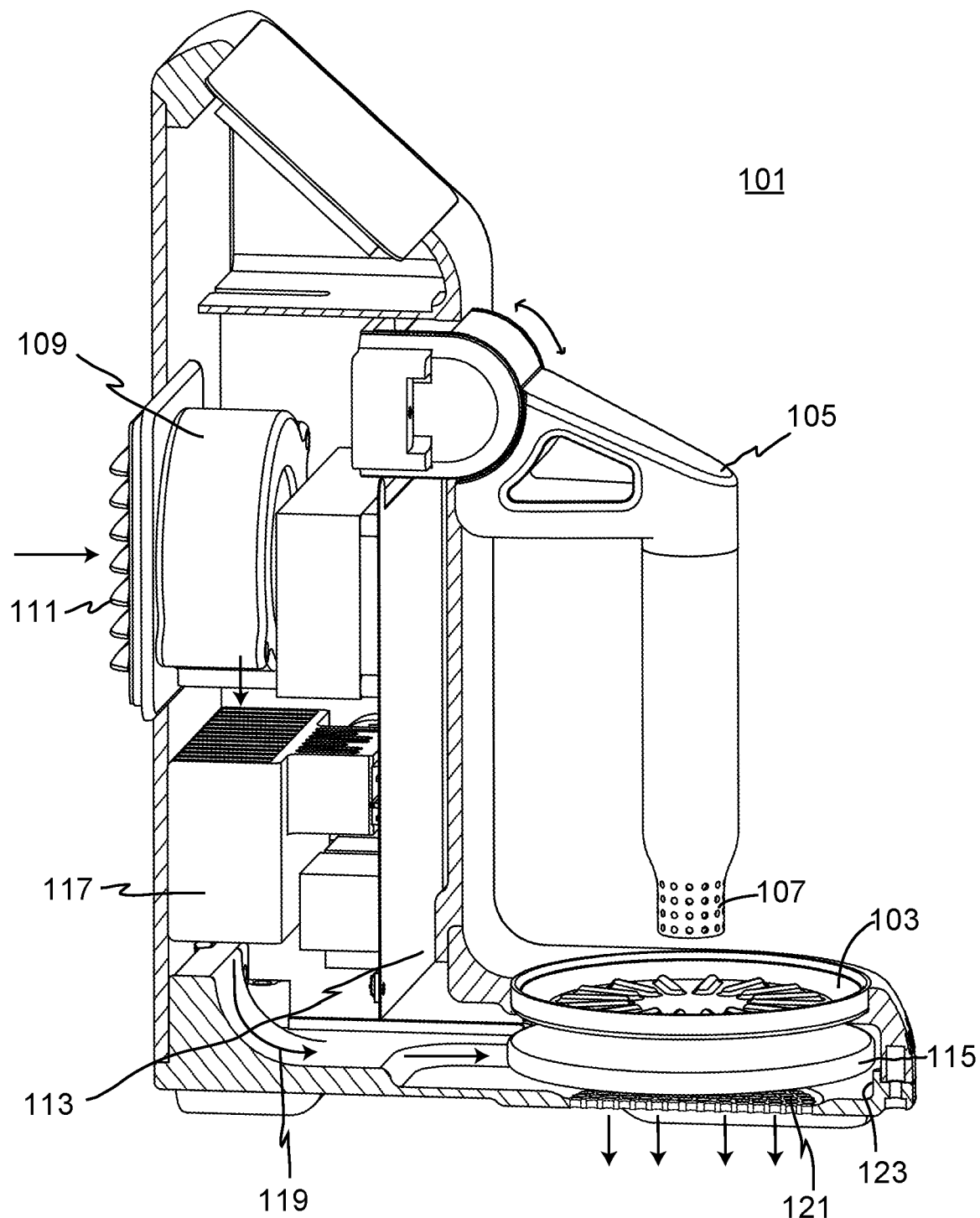
FIG. 1 shows a milk frother according to an embodiment of the present disclosure.

Where reference is made in any one or more of the accompanying drawings to steps and/or features, which have the same reference numerals, those steps and/or features have for the purposes of this description the same function(s) or operation(s), unless the contrary intention appears.

It is to be noted that any discussions contained in the "Background" section relating to prior art arrangements relate to discussions of documents or devices which form public knowledge through their respective publication and/ or use. Such should not be interpreted as a representation by the present inventor(s) or the patent applicant that such documents or devices in any way form part of the common general knowledge in the art.

An example appliance in the form of a milk heater and frother is shown in FIG. 1 where the external covering of the frother is not shown to enable the internal workings to be shown.

Figure 2:
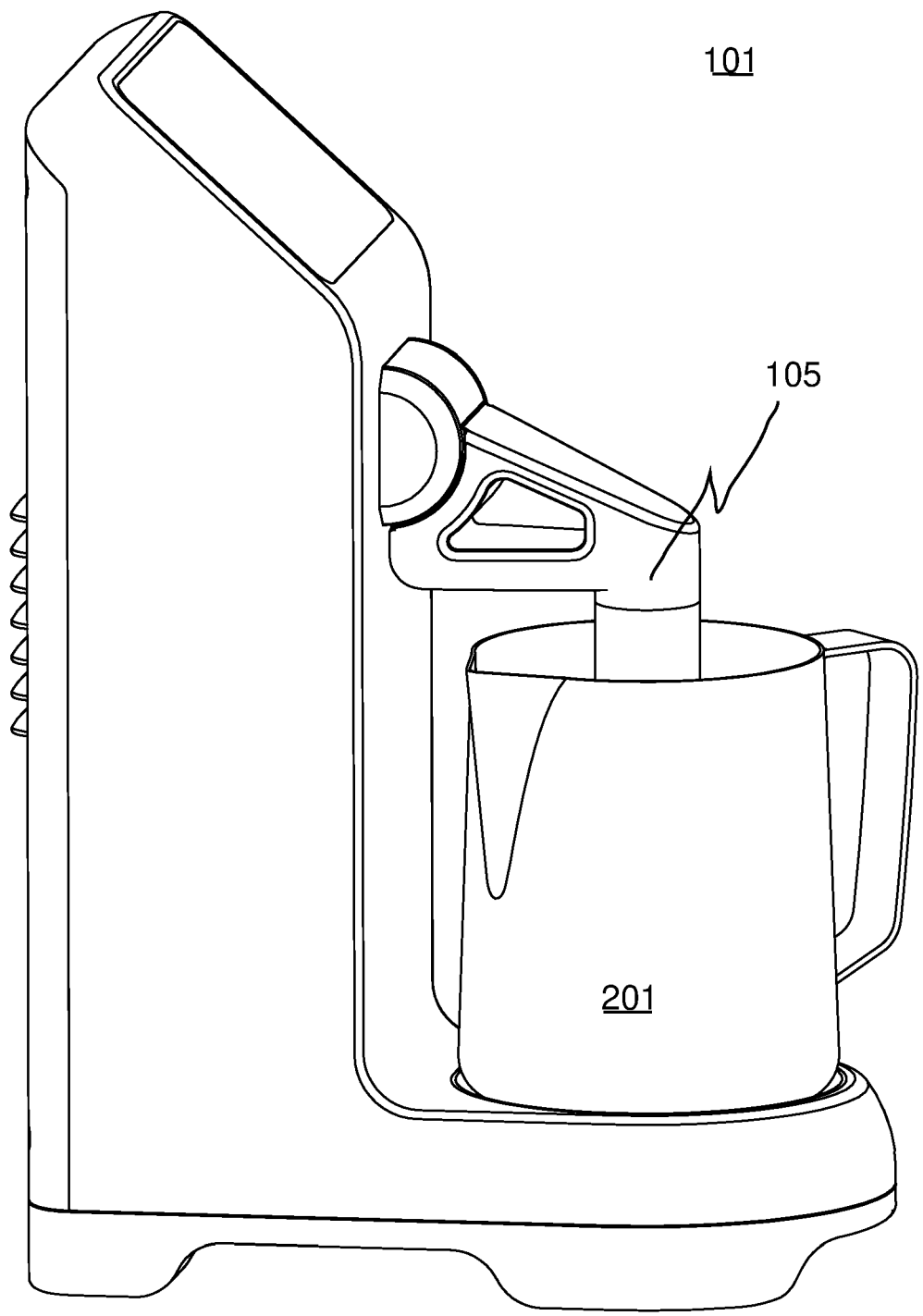
FIG. 2 shows the milk frother of FIG. 1 in use.

The frother 101 includes a base 103 upon which a metal receptacle (not shown) may sit. The metal may be any suitable ferrous metal, such as stainless steel for example. A movable wand 105 can move between a vertical position (as shown in FIG. 1) and a non-vertical position to allow the receptacle to be placed on the base 103 with the wand located inside the receptacle, as shown in FIG. 2.

An induction PCB 113 contains an induction heating circuit, AC power supply, control circuit and induction driving circuit. The induction driving circuit drives an inductor 115.

A heatsink 117 having multiple cooling fins is located in another airflow path that exits the centrifugal fan. The heatsink 117 is used to cooling a semiconductor switch (IGBT) and a rectifier of the induction heating circuit, which will be described in more detail below.

As shown in FIG. 1, incoming air follows an air flow in a horizontal direction or along a horizontal path (relative to the surface upon which the appliance is sitting, or relative to the surface of the base of the appliance) through the fan 109. The fan changes the direction of the air flow so that the air flow output from the fan is perpendicular to the input air flow. That is the fan changes the direction of air flow through 90 degrees, in this case, downwards. The air flow output from the fan passes through the heatsink fins and meets an airflow diversion element 119 formed as a curved portion that changes the direction of the airflow so that the air flow changes from a downward (vertical) direction to a lateral (horizontal) direction, so that the incoming air is directed horizontally towards the inductor 115. The air flow diversion element may be formed from the same material as the base. Beneath the inductor is a vent 121, which allows the flow of air to exit after passing by the inductor 115 and reaching a wall 123 in the airflow channel. This arrangement provides improved cooling of both the circuit elements of the appliance as well as the inductor 115.

FIG. 2 shows the milk frother 101 of FIG. 1 with a receptacle 201 provided on the base of the frother.

The induction heating circuit typically consists of 3 parts, namely a high voltage circuit, an induction driver circuit and a controller circuit. The high voltage circuit converts the mains power to a high frequency signal which powers an inductive coil in order to generate the magnetic field. The high frequency signal is produced by turning a semiconductor switch on and off at high frequency. The driver circuit part boosts the switching signal from the controller circuit to a higher voltage without changing its timing characteristics. The controller circuit typically consists of a microcontroller, which produces the switching signal and allows communication with other microcontrollers.

Figure 3:
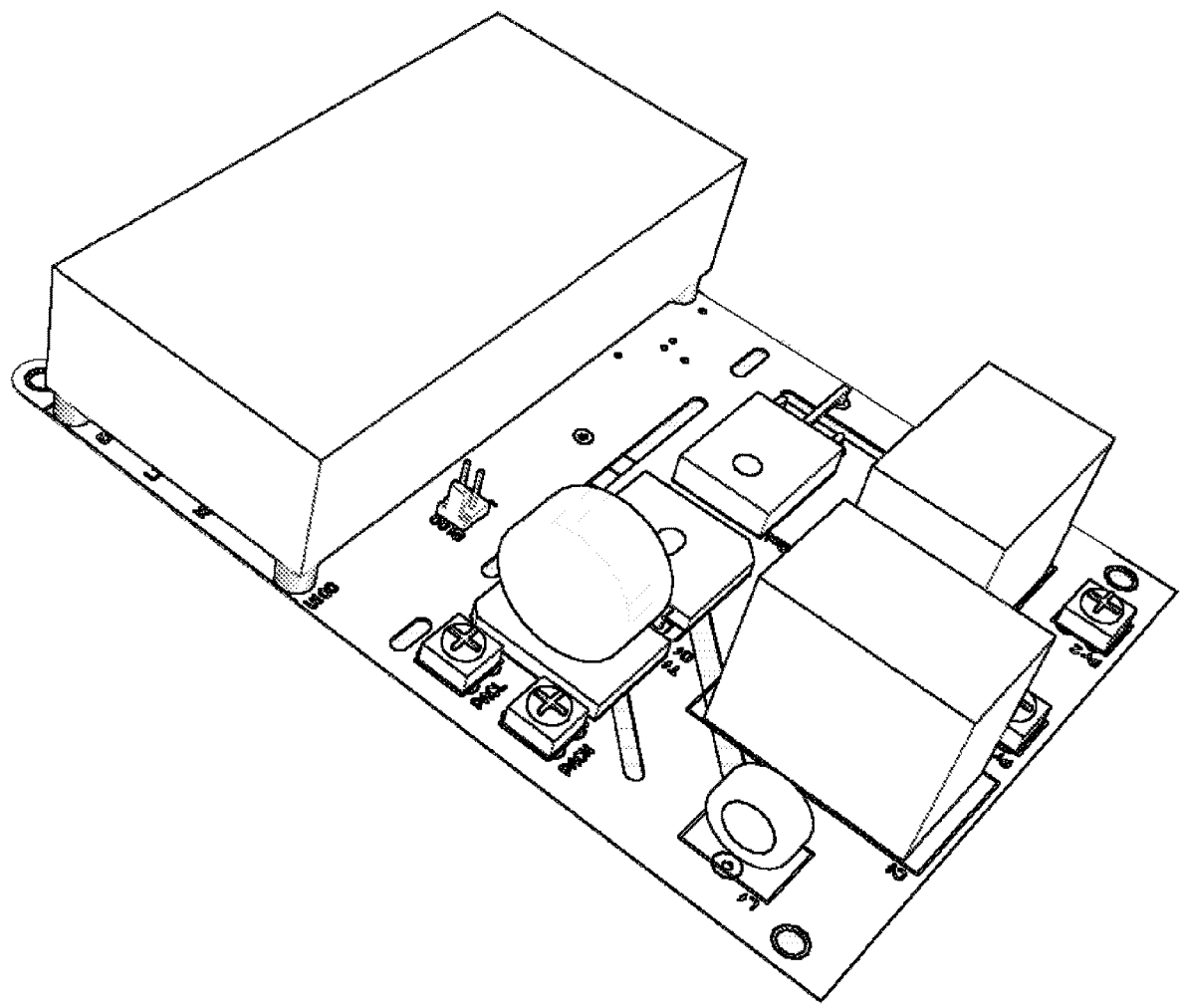
FIG. 3 shows a bottom view of an induction heating circuit board according to an embodiment of the present disclosure.
Figure 4:
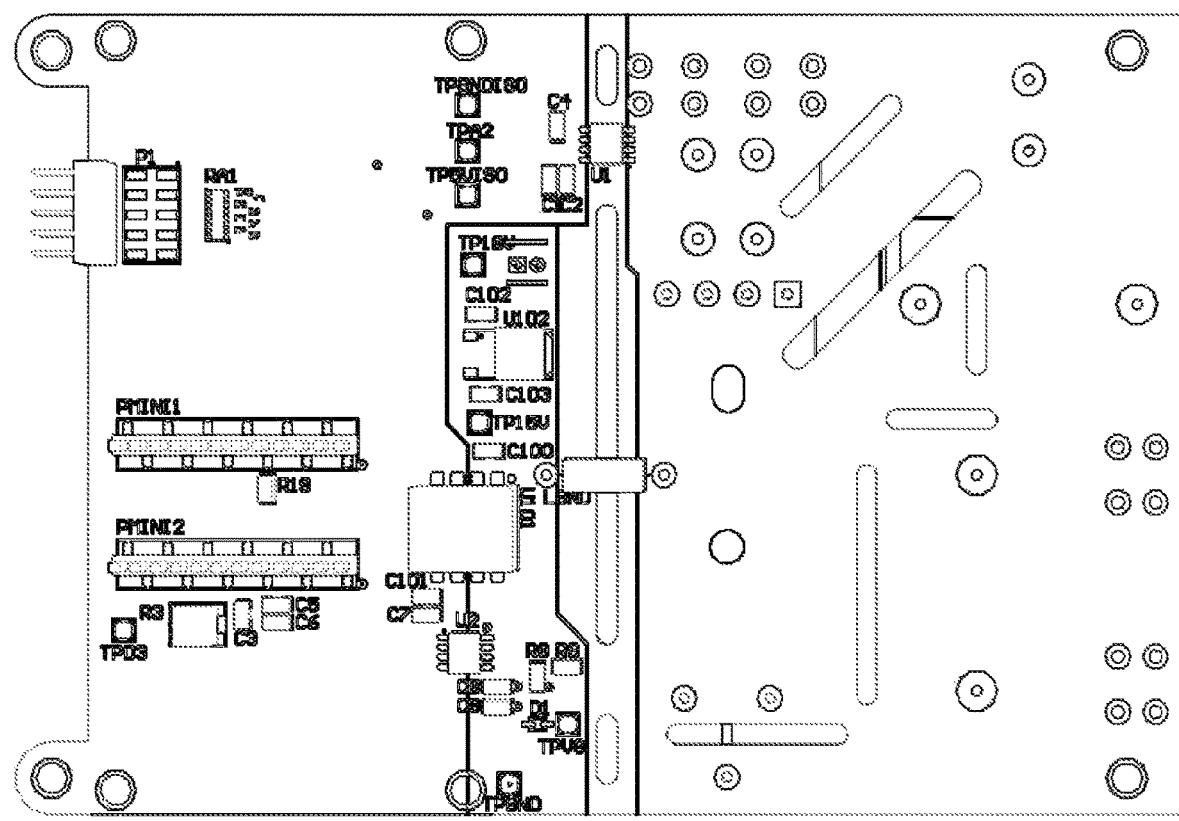
FIG. 4 shows a top view of the induction heating circuit board of FIG. 3.

The induction heating circuit is based on a "single-switch" topology since it only uses one switching device, which is an IGBT (Insulated Gate Bipolar Transistor). The advantage of this topology is simplicity while able to achieve high power output (for example, up to 3 kW). Its simplicity allows for the use of a more compact form factor as well as the use of more cost effective low-end microcontrollers. One reason for the compact size is the fact that a current transformer, for detecting the mains current being drawn, is not required. Removal of this current transformer from the design results in the size of the circuit board being reduced to only 140 mm×102 mm as shown in FIG. 3 and FIG. 4. The overall height of the circuit board is about 45 mm, excluding the heatsink. FIG. 3 shows a bottom view of the induction heating circuit board. FIG. 4 shows a top view of the induction heating circuit board.

Figure 5:
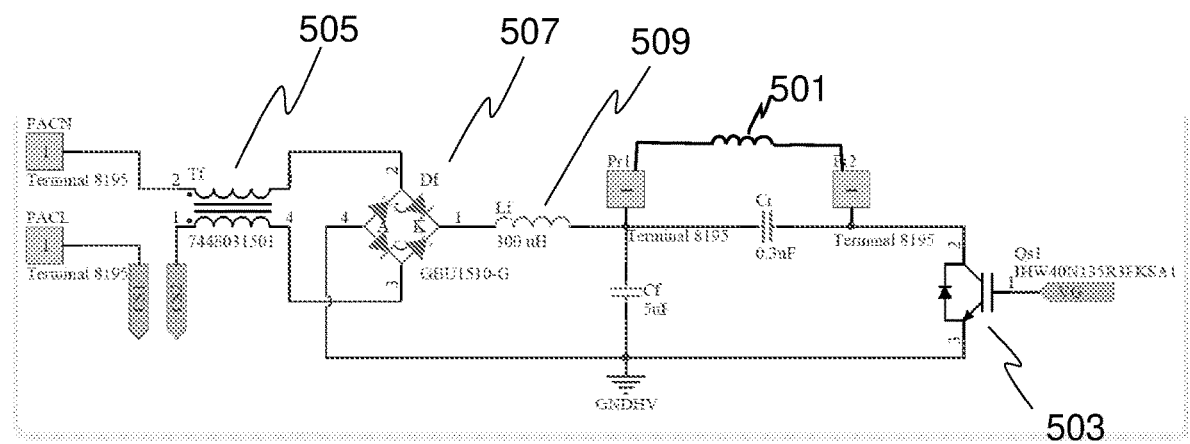
FIG. 5 shows a high voltage circuit that is used to drive an induction coil to heat a load in accordance with an embodiment of the present disclosure.

FIG. 5 shows a high voltage circuit that is used to drive an induction coil 501 to heat the load connected to Pr1 and Pr2 shown in FIG. 5. A switch in the form of an IGBT (Insulated Gate Bipolar Transistor) 503 is controlled by a microcontroller (see FIG. 8) by way of a switching signal generated by the microcontroller to drive the IGBT on line VG.

The high voltage circuit has a common mode inductor 505 formed from a pair of inductors wrapped around a common iron core, a full wave rectifier 507 and an LC filter consisting of an inductor Lf and a capacitor Cf.

The high voltage circuit is made up of 3 parts, namely, a filter, an LC-tank and a switch 503, as shown in FIG. 5. The filter converts 50/60-Hz mains voltage to DC voltage using the full-bridge rectifier 507, Df, and the LC-filter (Lf and Cf). Given 240 VAC, the DC voltage is 240×√2=339 V.

The LC-tank consists of the capacitor, Cr, and the induction coil 501, Lr, which is connected to ports Pr1 and Pr2. The LC pair acts as an electrical resonator which alternatingly stores electrical energy and generates an oscillatory signal at a fixed frequency. The frequency is $$f = \frac{1}{2\pi\sqrt{L_r C_r}}$$

Given Lr=75 µH and Cr=0.33 µF, the frequency is approximately 32 kHz.

The switch, Qs1, is a semiconductor switch with a high power rating, referred to herein as the IGBT (Insulated Gate Bipolar Transistor). When the IGBT is turned on, the DC voltage charges the coil and capacitor leading to the electrical energy being stored in the LC-tank. A linearly increasing current flows through the coil, as shown by the 605 waveform in the box 607 in FIG. 6, which shows the voltages generated by the high voltage circuit in a screenshot of an oscilloscope. The switching signal is shown as a square wave 601. The IGBT voltage is shown as wave 603. The induction coil current is shown as wave 605. The Box 607 shows the ON stage. The Box 609 shows the OFF stage.

When the switch is turned off, the energy is discharged within the LC-tank. The voltage and current start to oscillate as shown by the 603 and 605 waveforms, respectively, in the box 609 in FIG. 6. When the voltage is close to zero, the IGBT is turned on again and the cycle repeats. The practice of turning on the IGBT when its voltage is close to zero is usually called "soft-switching", which is recommended in order to avoid damaging the IGBT.

Figure 6:
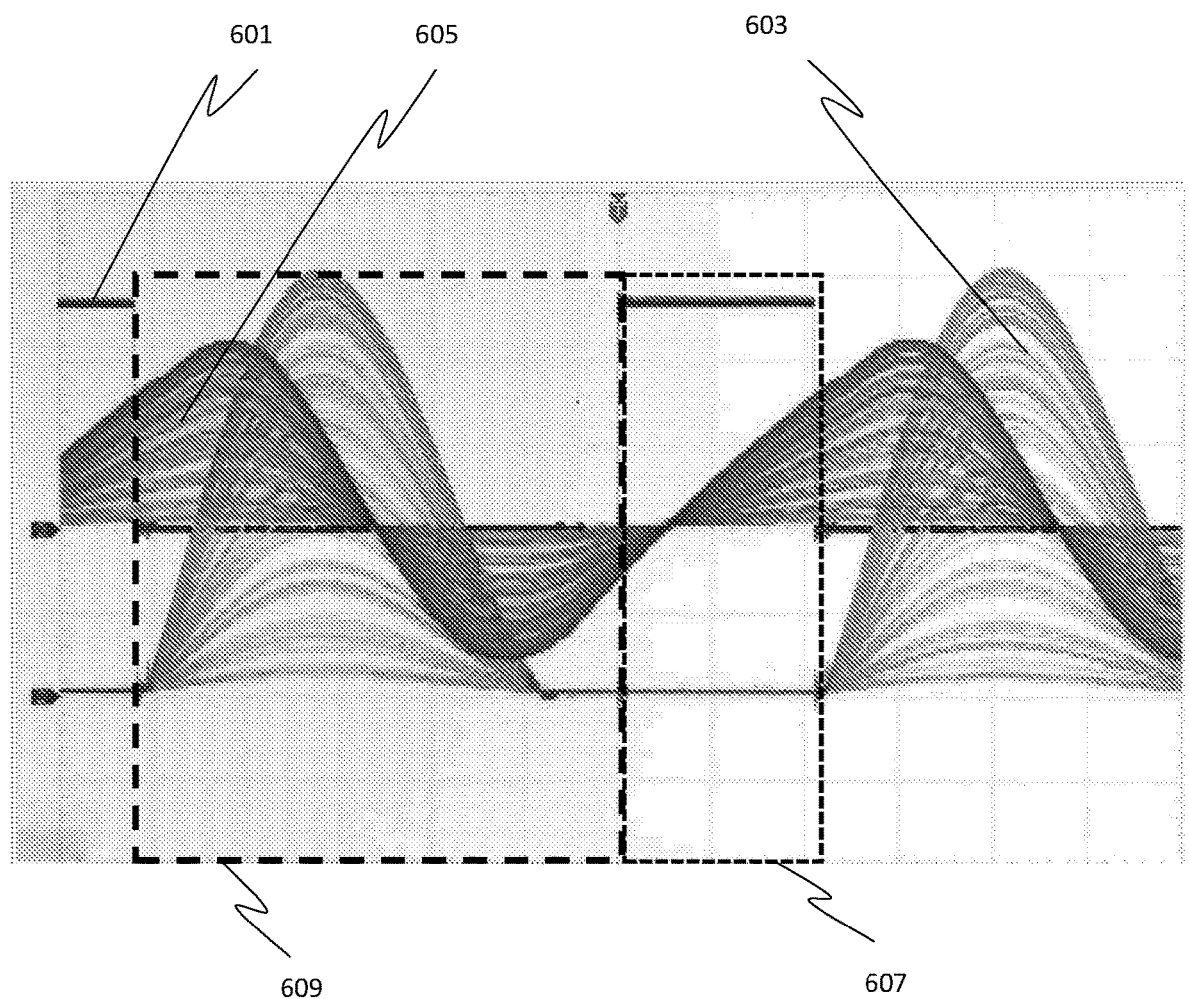
FIG. 6 shows a screenshot of high voltage readings taken from the high voltage circuit in accordance with an embodiment of the present disclosure.

The switching signal is a square wave with a fixed period (601 waveform in FIG. 6). The square wave's amplitude switches between 0 and +15V, which turns off and on the IGBT, respectively. Longer on stage, Ton, will lead to more energy being stored in the LC-tank. Hence, when the IGBT is turned off, the current and voltage generated by the LC-tank will be higher.

In this embodiment, the period of the square wave ranges from 36 to 49 µs. Ton may range from 8 to 26 µs and Toff may be adjusted manually such that the IGBT voltage is close to zero before the next on stage. The current drawn by the circuit ranges from 3 A to 16 A, respectively. If Ton is less than 8 µs, the voltage across the IGBT never returns to zero during the off stage. Hence, there is a reasonably high voltage across the IGBT when it is switched on, which could potentially damage the IGBT. This condition is called "hard-switching". Where Ton=26 µs, the IGBT peak voltage is over 1500 V and the peak current is over 80 A. Herein described processes are used to reduce the risk of any potential issues with regard to high voltage and current generated by the IGBT.

Figure 7:
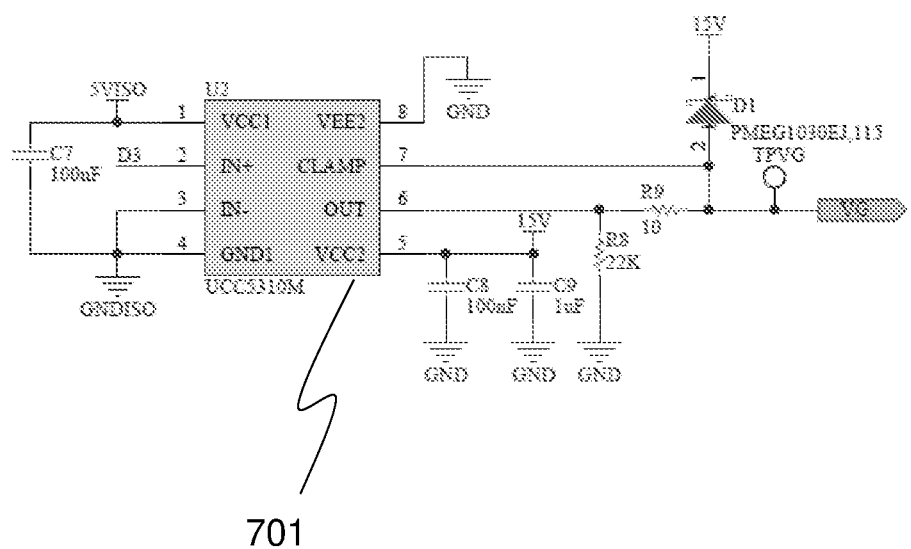
FIG. 7 shows an inductive driver circuit in accordance with an embodiment of the present disclosure.

FIG. 7 shows an embodiment of an induction driver circuit with an IGBT driver 701 in the form of chip UCC5310M. The driver circuit is used to boost the switching signal in order to control the IGBT. Pin D3 provides an input to the IGBT driver 701 in the form of a square wave switching signal, which is generated by the microcontroller (see pin 6 of PMINI1 in FIG. 8). The output VG of the induction driver circuit is used to drive the IGBT (see FIG. 5).

The driver 701 ground, GND, is bridged to the high voltage's ground, GNDHV in FIG. 5, by a 10 µH inductor (not shown). This inductor is made from 1 turn of enamelled AWG14 wire around a small toroidal core. This inductor allows direct electrical connection but stops any current surge from the high voltage circuit to damage the driver circuit of FIG. 7.

Figure 8:
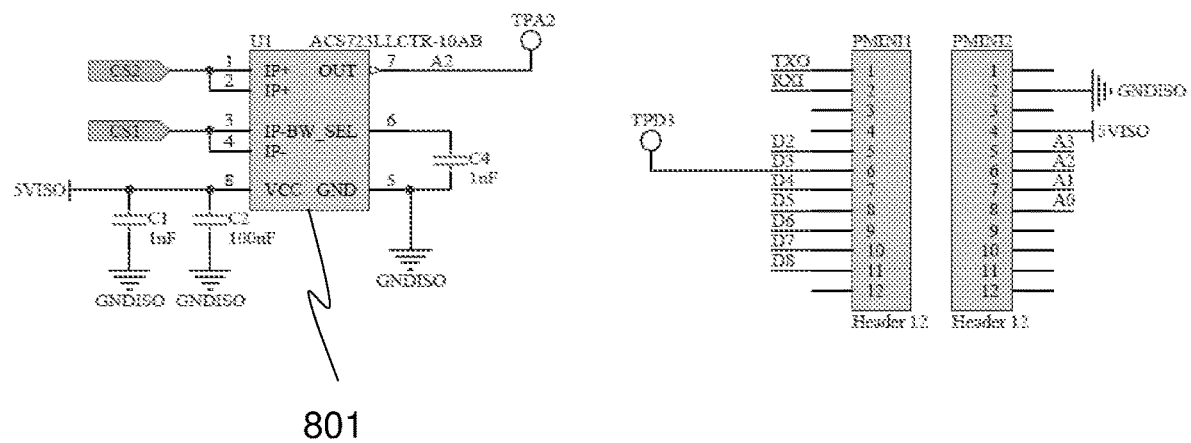
FIG. 8 shows a controller circuit and connection ports to a microcontroller in accordance with an embodiment of the present disclosure.
Figure 8:
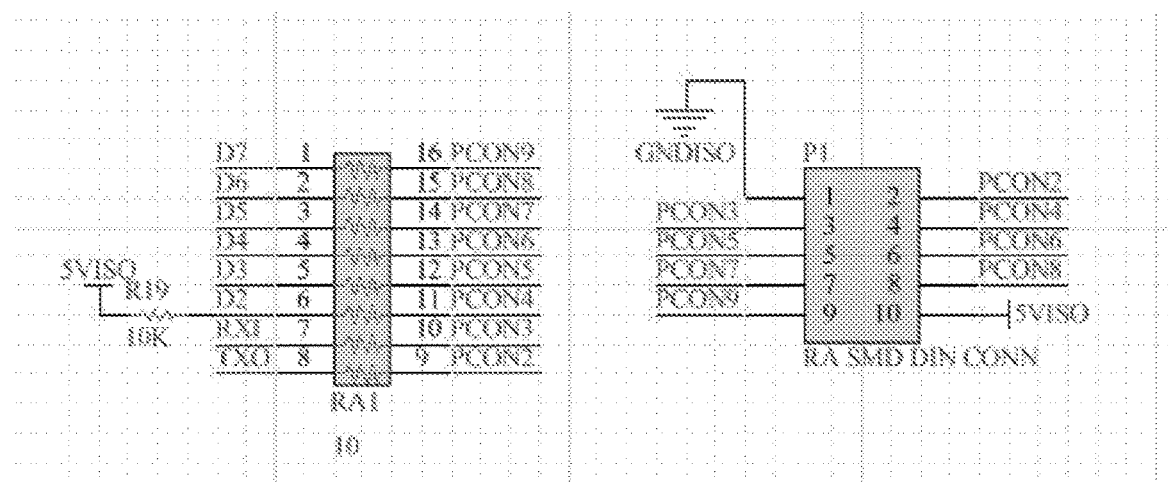

The controller circuit primarily consists of a microcontroller module and a current sensor 801 as depicted in FIG. 8. It will be understood that one or more suitable microcontrollers may be used, but that the programming of the microcontroller(s) is specific to the operations described herein. The microcontroller is connected to the circuit through the PMINI1 and PMINI2 ports, as shown in FIG. 8. In this embodiment, the microcontroller only considers the input and output pins shown in Table 1 below. However, it will be understood that the microcontroller may be configured to operate with further inputs and outputs as needed.

As can be seen in FIG. 8, the semiconductor current sensor 801 receives two current sense inputs, CS1 and CS2 from the AC input of the high voltage circuit shown in FIG. 5. The sensor 801, which in this embodiment is chip U1, ACS723LLCTR-10AB, produces an output signal A2, which is a linearly changing voltage with reference to the measured current via CS1 and CS2. That is, the output voltage signal A2 is linearly proportional to the current drawn from the mains power. For example, when the PWM's Ton is at a minimum level (8 microseconds), the mains current drawn is about 3 Amps and increases with Ton. The microcontroller may then set D7 to HIGH when the mains current is above a predefined limit, e.g. 2 Amps. When the load is removed while Ton is at 12 microseconds, the mains current will drop from 5 Amps to below 1 Amps. The microcontroller will detect this using the current sensor and so, set D7 to LOW and reduce Ton to 8 microseconds.

When the load is in place, the current will jump to 3 A (because Ton is already at 8 microseconds) which exceeds the limit, the normal operation is resumed where D7 is set to HIGH and Ton is increased progressively.

According to one example, the semiconductor current sensor is a Hall effect integrated circuit semiconductor current sensor. Any other suitable current sensor may be used. This sensor may work for both AC and DC. As previously mentioned, in prior systems, if a current transformer is used for low frequency (50/60 Hz), the transformer needs to have a specific size and be made from specific materials which usually results in a bulky transformer.

The output voltage A2 is fed into the microcontroller as shown in table 1 below.

TABLE 1

List of input and output pins of the microcontroller.

| Input | Description | Output | Description |
|---|---|---|---|
| A2 | Reading output voltage of the mains current sensor, U1. | D3 | Switching signal to the driver circuit |
| D5 | Controlling the switching signal: HIGH for on, LOW for off. | D6 | Heating status: HIGH for on, LOW for off |
| | | D7 | Current status: HIGH for above threshold, LOW for below threshold |

When the microcontroller senses HIGH at D5, it will output the switching signal at D3, which will, in turn, control the high voltage circuit via the input to the IGBT driver 701 at pin 2. As shown in FIG. 8, D5 is connected to another connector (RAI), which in turn, is connected to a further microcontroller that generates the D5 signal. In this embodiment, the switching signal's Ton will increase from 8 μs to 14 μs (the preset maximum in this embodiment) within 2 seconds. The microcontroller sets Pin D6 to HIGH when Ton is not zero. D6 provides a feedback signal to the further microcontroller indicating that the heating circuit is active. For example, D6 is set to HIGH as soon as the PWM is active, i.e. Ton is not zero. The microcontroller may wait for D5 to go HIGH, when D5 is HIGH, the microcontroller outputs the PWM at D3 and sets D6 to HIGH. There might be a short delay between D5's HIGH state and D6's HIGH state since the microcontroller takes time to react and enables its timer.

If there is sufficient current to drive the inductor as measured by the current sensor 801, then the microcontroller produces a HIGH signal on Pin D7 indicating that the current being drawn from the mains exceeds the threshold (where the threshold value indicates the minimum current required to drive the inductor). For example, this would be a typical case when a load (cooking pan or jug) is placed above the inductor coil. If the load is removed or placed too high above the coil, the microcontroller outputs a LOW on pin D7 based on the current measured by the current sensor 801 being below the threshold. Hence, the microcontroller can detect the presence of the load based on the measured current by the current sensor 80 and the output voltage A2 generated by the current sensor. Table 2 summarises the logic of these two indicators.

When D5 is set to HIGH by the further controller, the switching signal (PWM) is activated and its Ton increases from its minimum (8 microseconds) to the pre-programmed maximum (e.g. 12 microseconds) within a few seconds. If the load (e.g. milk jug) is removed, the mains current drops below a predefined limit, which is detected by the current sensor. In turn, Ton is reduced to its minimum level (8 microseconds). When the load is in place again, the mains current increases above its limit (again detected by the current sensor), the processor then resumes its normal operation and increases Ton to the pre-programmed maximum.

When input D5 is LOW, the switching signal is turned to LOW, which will switch off the high voltage circuit immediately. Both D6 and D7 should be LOW too. If D7 is HIGH, which implies that sufficient mains current is being drawn, there could be a fault in the circuit. An alarm should be activated to alert the user to switch off the system.

TABLE 2

Logic indicator of the heating and current status.

| | Heating status (D6) = LOW | Heating status (D6) = HIGH |
|---|---|---|
| Current status (D7) = LOW | Heating off | Load is removed |
| Current status (D7) = HIGH | Fault | Heating on |

The current sensor 801, U1, measures the current drawn from the mains. The mains current flows through one side of the sensor 801 via inputs CS1 and CS2, which produces a voltage A2 output that linearly changes with the current on the input side. Since sensor 801 in this embodiment is rated at 10 A, the output voltage A2 varies from 2.5 V to 5 V when the current varies from 0 to 10 A in one direction. When the current changes its direction, the output voltage A2 will vary from 2.5 V to 0 V.

By using a semiconductor-based sensor, the design becomes more compact as a current transformer is no longer required to sense the current. In the conventional design of induction heating circuit, a current transformer is usually used. This transformer is taller and has a much larger footprint.

Figure 9:
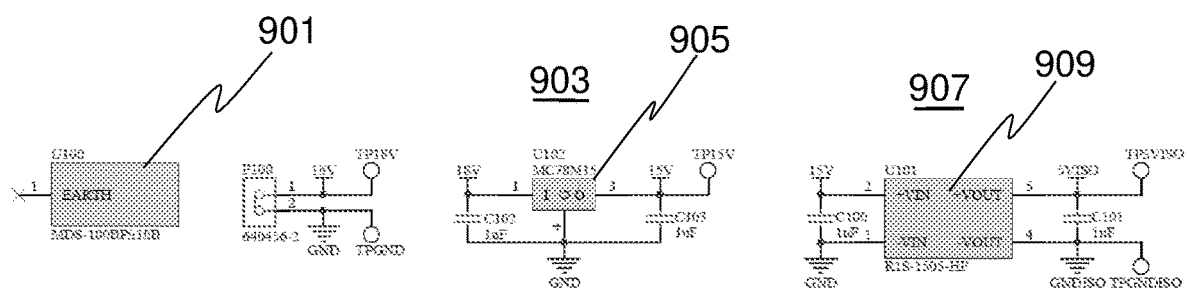
FIG. 9 shows power supply circuits in accordance with an embodiment of the present disclosure.

The power supply circuit shown in FIG. 9 contains several voltage regulators since various components require electrical isolation and different voltages. The primary power supply unit 901, U100, converts the mains voltage to 18 VDC and provides it to the voltage step down circuit 903 through port P100. The 18 VDC is stepped down to 15 VDC using a linear regulator 905, U102. Then, the 15 VDC is further stepped down in voltage stepdown circuit 907 to 5 VDC using an isolated DC-DC converter 909, U101. Hence, the controller circuit is electrically isolated from the driver and high voltage circuits.

In summary, the above described induction heating circuit consists of high voltage, driver and microcontroller circuits. The high voltage circuit converts the mains voltage to DC voltage. A power switch (IGBT) turns on and off so that in the on stage, the DC voltage stores energy in the LC-tank while in the off stage, the energy is discharged. Such high frequency alternating current generates high frequency magnetic field which in turn, generates heat on the load. The IGBT is controlled by a switching signal, which is generated by the microcontroller and boosted by the driver circuit.

The following describes a circuit and process for monitoring the inductor switch (IGBT) voltage and current and based on the monitoring, controlling the switching signal.

This document describes low cost technique to sense the voltage and current of an IGBT in order to prevent damaging it. The technique only needs several logic ICs, optocouplers and a regular microcontroller. The circuit compares the IGBT voltage and current against the specified limit. The comparison output signals are sent to the microcontroller circuit through optocouplers. These signals can immediately clamp the PWM signal from the microcontroller to switch off the IGBT. This feature is necessary since a regular microcontroller would be too slow to switch off the IGBT (within microseconds) when required. Monostable multivibrators might also be used to "stretch" these signals since they can be short pulses (in microseconds) and too fast to be detected by a regular microcontroller. The next two sections describe the technique in more details.

Figure 10:
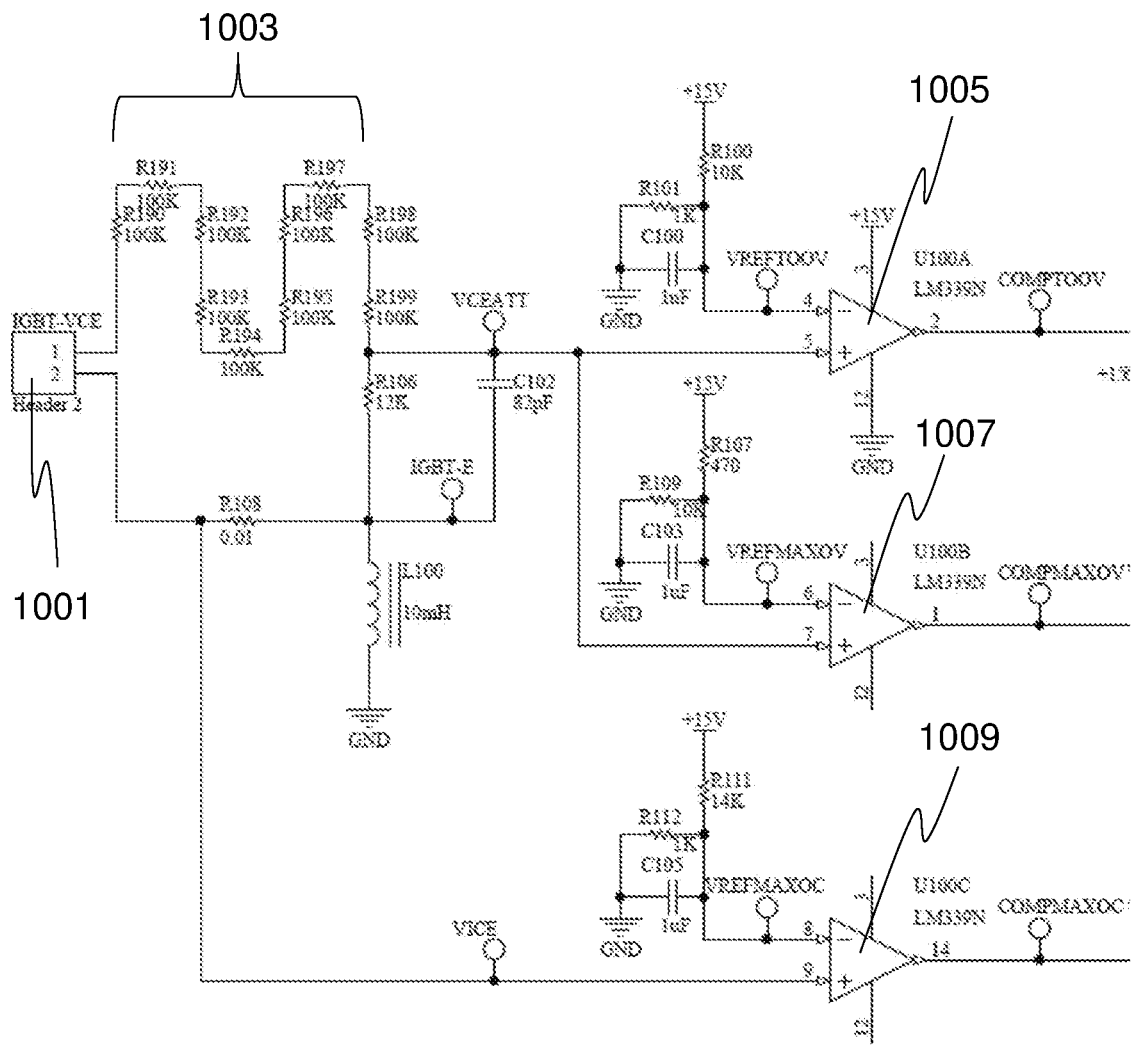
FIG. 10 shows a voltage/current comparison circuit according to an embodiment of the present disclosure.

FIG. 10 shows a voltage/current comparison circuit according to this embodiment.

The IGBT's VCE is input 1001 into the voltage/current comparison circuit and attenuated, in this embodiment, by around 84 times, at point VCEATT. A voltage divider circuit 1003 (R190-R199 and R106) is used to attenuate the input voltage IGBT VCE. This attenuated voltage VCEATT is then compared with two specified voltage limits (VREFTOOV and VREFMAXOV) using high-speed comparators 1005 and 1007, which in this embodiment is chip LM339. The lower limit, VREFTOOV, is used to determine if the attenuated voltage VCEATT is within the safe limit (i.e. below a predetermined threshold) before switching on the IGBT. This is referred to as "turn-on overvoltage" or TOOV. In this example, VREFTOOV is set to 1.36 V. That is, the IGBT will only be switched on if its Vce is below 1.36×84=114 V.

The upper limit, VREFMAXOV, is used to determine whether the attenuated voltage VCEATT exceeds the maximum overvoltage limit (MAXOV). In this example, this limit is set 14.33 V and so the overvoltage limit is 14.33× 84=1200 V. This limit is chosen in accordance with this example based on the IGBT maximum voltage rating, which in the specific circuit shown is 1200 V.

For the current sensing, the IGBT's current passes through a current-sense resistor, R108, and the voltage across the resistor R108 is compared with a specified limit, VREFMAXOC, using another comparator 1009 (LM339). As an alternative to the current sense resistor, a current transformer may be used. For a current limit of 100 A, the resistance of R108 is selected to be 0.01 Ohm and VREFMAXOC is set to 1 V as a threshold value.

Figure 11:
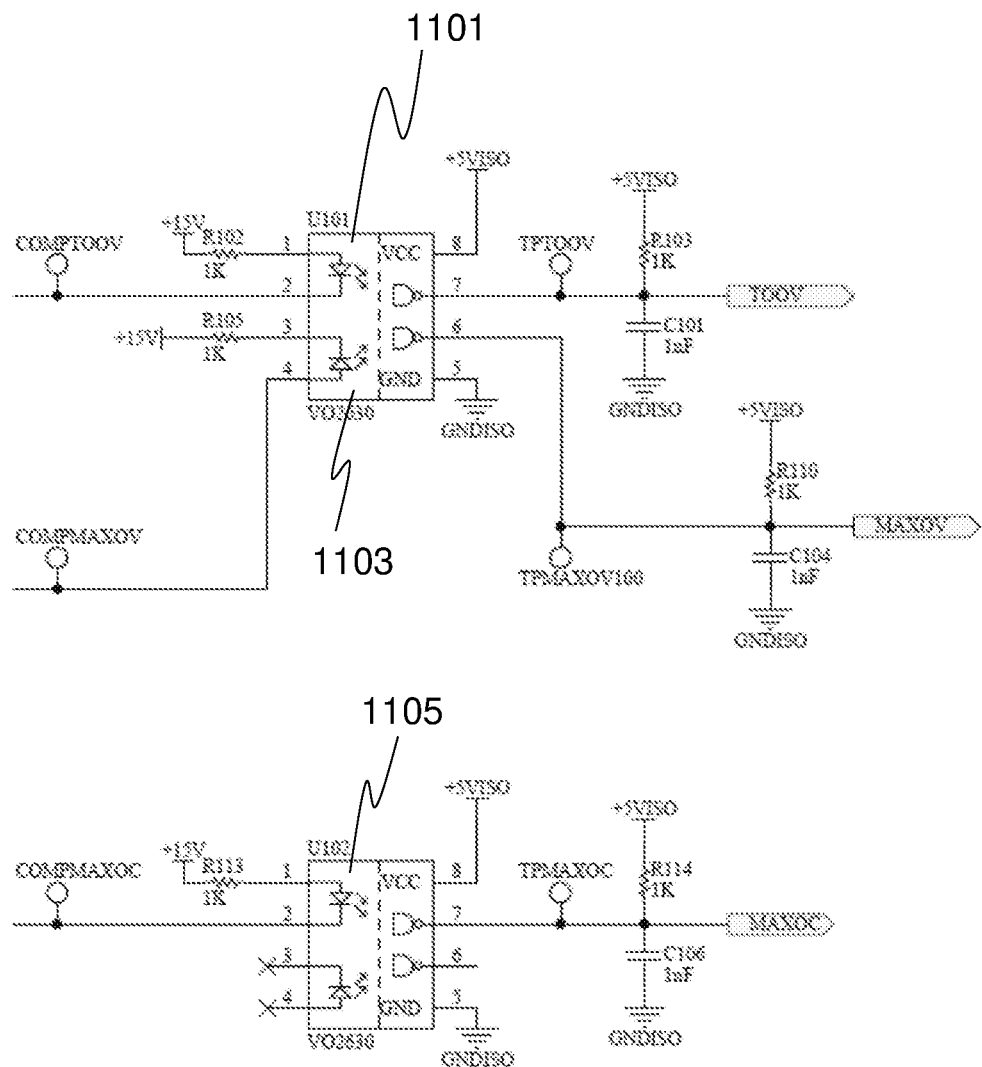
FIG. 11 shows optocoupler circuits in accordance with an embodiment of the present disclosure.

The three comparison outputs (COMPTOOV, COMPMAXOV and COMPMAXOC) are then propagated to the logic/microcontroller circuit through three optocouplers (1101, 1103, 1105), as shown in FIG. 11 to provide electrical isolation from the IGBT voltage. The outputs of the optocouplers are referred to as TOOV, MAXOV and MAXOC respectively.

Figure 12:
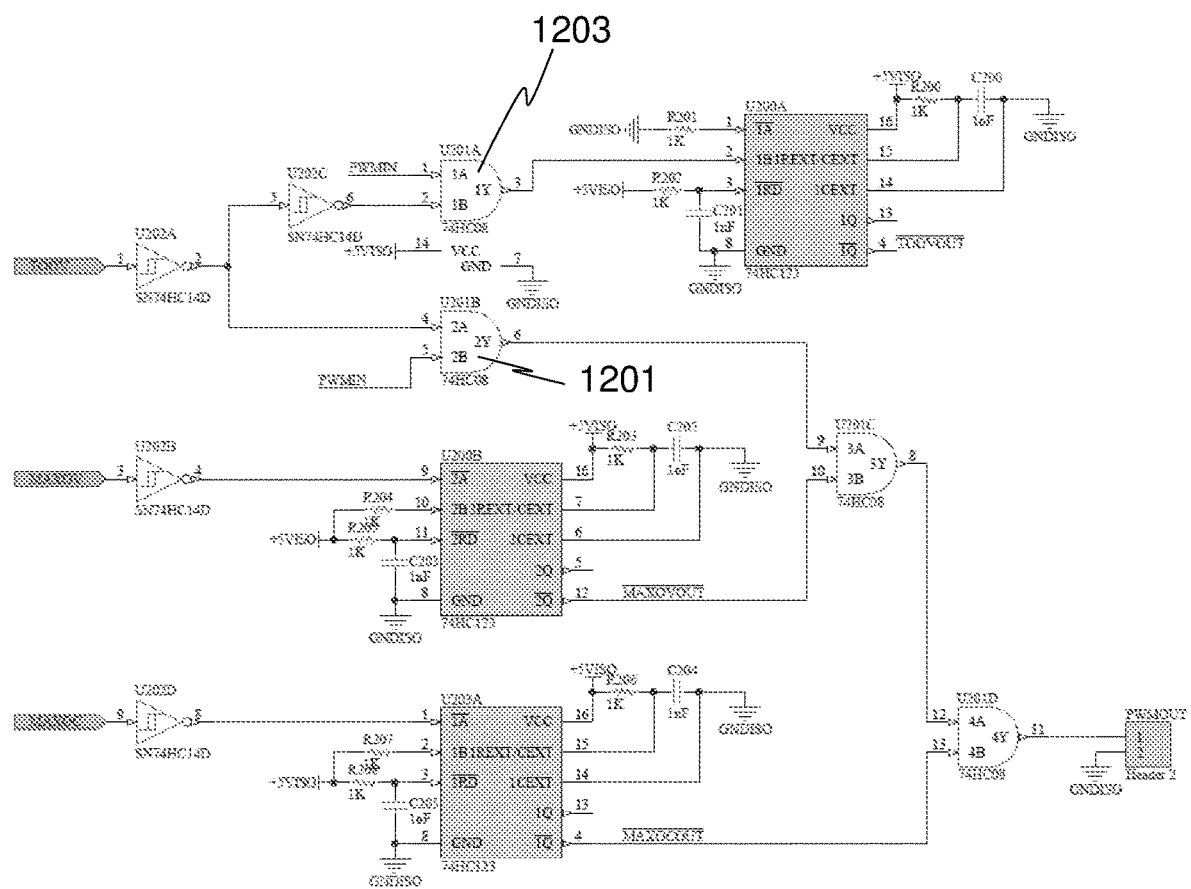
FIG. 12 shows logic circuits in accordance with embodiments of the present disclosure.

In the logic circuits of FIG. 12, the comparison output TOOV (after being opto-coupled) is ANDed 1203 with the PWM signal (i.e. the switching signal 601 in FIG. 6), and also TOOV is inverted to the correct polarity and ANDed 1201 with the PWM signal.

Firstly, when Vce of the IGBT exceeds the turn-on overvoltage limit, COMPTOOV clamps the PWM to LOW until the Vce is below the limit. Therefore, the turn-on overvoltage signal clamps the PWM (switching signal) to the low state thereby turning off the switching component (IGBT). The circuit includes U201A [1203] and U200A. The resulting PWM then has a smaller on time, which will lead to lower Vce in the next cycle. Hence, this forms a negative feedback to regulate the PWM width so that the IGBT is operating at a safe limit. The ANDing of COMPTOOV and PWM is also passed to a monostable multivibrator so that it can be detected by the microcontroller. The microcontroller may count the number of occurrences and switch off the PWM when the limit is exceeded.

Secondly, COMPMAXOV and COMPMAXOC are stretched by monostable multivibrators, whose outputs are detected by the microcontroller and ANDed with the PWM. The PWM is clamped off for a certain period until the microcontroller detects these two comparison outputs and switches off the PWM.

The circuits above detect whether the IGBT's voltage and current exceed a set of limits and outputs digital signals. In this example, the maximum voltage and current are set to 1200 V and 100 A, respectively, and the maximum voltage during turn on is set to 114 V. These signals are fed to the microcontroller so that it can switch off the PWM to prevent damaging the IGBT. Since the microcontroller cannot react within microseconds, these signals also clamp off the PWM temporarily until the microcontroller switches off the PWM properly. Therefore, when any of the comparator output signals (COMPTOOV, COMPMAXOV and COMPMAXOC) is low, the output of the AND gate will be low, regardless of the PWM's state (high or low). If all comparator output signals (COMPTOOV, COMPMAXOV and COMPMAXOC) are high, the output of the AND gate follows the PWM.

The circuit in this embodiment consists of
1. 1×14-pin LM339 quad comparators
2. 2×8-pin VO2630 dual high-speed optocouplers
3. 1×14-pin 74HC14 hex Schmitt-trigger inverters
4. 1×14-pin 74HC08 quad AND gates
5. 2×16-pin 74HC123 dual monostable multivibrators
6. Passive components (resistors and capacitors)

The overall footprint is expected to be smaller than 30×60 $mm^2$.

According to one example, an induction heating circuit is provided that includes a Hall effect integrated circuit current sensor for measuring the AC mains current. This enables mains overcurrent detection and load detection. A semiconductor switching component (e.g. IGBT) may be used in a single switching topology. The switching component may be driven by a switching signal which is produced by a (low-end or simple) processor. A fast-acting protection circuit may compare the voltage and current of the switching component with a preconfigured level implemented as an analogue circuit. The protection circuit may transfer the comparator outputs to the processor side via optocouplers which may then can clamp the switching signal within microseconds.

The load detection may be carried out by monitoring the current sensor and detecting the sensed current reaching a defined threshold that indicates a load is present. For example, if the load is present, the current drawn from the mains will exceed a certain limit. The resulting sensor's output voltage then can be detected by the microcontroller to enable the microcontroller to determine the load status (e.g. load present or not present) based on the sensed current.

According to another example, fast-acting circuitry may be provided that protects a switching component in an induction heating circuit from overvoltage by monitoring the voltages between the collector and the emitter of the switching component, and between the gate and the emitter of the switching component. The circuitry may protect overcurrent by monitoring the current flowing through the collector and the emitter of the switching component. The circuitry may include high-speed comparators as part of the monitoring circuitry to compare the voltages and current against predetermined limits. The circuitry may include optocouplers to transfer the comparator output values (the voltage values and current values) to the processor side (e.g. the logic circuitry) and provide electrical isolation. The circuitry may include logic circuitry that includes AND gates to couple the transferred comparator output with the switching signal such that the final output of the AND gate is a low state when any of the voltage or current exceeds their limit, thus, effectively turning off the switching component. The circuitry may include a monostable multivibrator to stretch the comparator output signals (e.g. the monitored voltage signals and monitored current signals) allowing the microcontroller to detect the overvoltage or overcurrent. The circuitry may include a cascade of 3×2-input AND gates. Alternatively, the circuitry may include a single 4-input AND gate. Other suitable logic circuit arrangements may also be used to carry out the same logic functionality.

It will be understood that, instead of a microcontroller, a timing circuit may also be used to generate the switching signal.

INDUSTRIAL APPLICABILITY

The arrangements described are applicable to induction heating industries, and particularly to the appliance induction heating industry.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. A protection circuit for protecting an induction heating circuit in an appliance, the protection circuit comprising:
    a monitoring circuitry arranged to monitor a switching device in an induction heating circuit, wherein a first voltage, a second voltage and a current are monitored by the protection circuit; and
    logic circuitry configured for clamping a switching signal for the switching device on the basis of the first voltage, second voltage, and current, wherein the first voltage is indicative of a turn on voltage across the switching device, the second voltage is indicative of a maximum over voltage across the switching device, and the current is indicative of a maximum current through the switching device.

2. The protection circuit of claim 1 wherein the monitoring circuitry comprises high speed comparators to compare the first voltage, second voltage and current against respective predefined thresholds.

3. The protection circuit of claim 1 wherein the protection circuit comprises optocouplers arranged to provide electrical isolation and transfer values associated with the first voltage, the second voltage and the current to the logic circuitry.

4. The protection circuit of claim 1 further comprising at least one monostable multivibrator arranged to stretch a first voltage associated with the first voltage, a second voltage signal associated with the second voltage and a current signal associated with the current.

* * * * *